United States Patent
Yang et al.

(10) Patent No.: US 8,194,478 B2
(45) Date of Patent: Jun. 5, 2012

(54) SYSTEMS AND METHODS FOR WRITING TO MULTIPLE PORT MEMORY CIRCUITS

(75) Inventors: Haining Yang, San Diego, CA (US); Zhongze Wang, San Diego, CA (US); ChangHo Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 210 days.

(21) Appl. No.: 12/699,933

(22) Filed: Feb. 4, 2010

(65) Prior Publication Data

US 2011/0188328 A1    Aug. 4, 2011

(51) Int. Cl.
   *G11C 7/00* (2006.01)
(52) U.S. Cl. ......... 365/189.16; 365/230.05; 365/230.06; 365/185.23
(58) Field of Classification Search .......... 365/189.16, 365/230.05, 230.06, 185.23
See application file for complete search history.

(56) References Cited

U.S. PATENT DOCUMENTS

| 4,764,899 | A | * | 8/1988 | Lewallen et al. | 365/189.11 |
|---|---|---|---|---|---|
| 4,984,204 | A | * | 1/1991 | Sato et al. | 365/189.11 |
| 5,982,699 | A | | 11/1999 | Dilbeck | |
| 6,373,779 | B1 | * | 4/2002 | Pang et al. | 365/230.05 |
| 6,816,401 | B2 | * | 11/2004 | Kauffmann et al. | 365/154 |
| 6,901,000 | B1 | * | 5/2005 | Ichiriu et al. | 365/49.17 |
| 7,580,317 | B2 | * | 8/2009 | Kato | 365/230.05 |
| RE41,325 | E | * | 5/2010 | Yu et al. | 365/230.05 |
| 7,894,280 | B2 | * | 2/2011 | Houston | 365/189.14 |
| 2008/0259681 | A1 | | 10/2008 | Branch et al. | |
| 2009/0027978 | A1 | * | 1/2009 | Noda et al. | 365/189.17 |
| 2011/0194370 | A1 | * | 8/2011 | Shiu | 365/230.03 |

OTHER PUBLICATIONS

International Search Report and Written Opinion—PCT/US2011/023716—ISA/EPO—Jun. 21, 2011.

* cited by examiner

*Primary Examiner* — Tuan T. Nguyen
(74) *Attorney, Agent, or Firm* — Sam Talpalatsky; Nicholas J. Pauley; Jonathan T. Velasco

(57) ABSTRACT

A multiple-port RAM circuit has a data-in line coupled to multiple bit lines and multiple bit line bars. The circuit also has multiple word lines. A memory cell is coupled to the bit lines, bit line bars, and word lines. The circuit further includes a controller than enables the word lines to substantially simultaneously write a value from the bit lines to the memory cell.

12 Claims, 6 Drawing Sheets

SYSTEMS AND METHODS FOR WRITING TO MULTIPLE PORT MEMORY CIRCUITS

TECHNICAL FIELD

The present description generally relates to multiple-port memory circuits and, more specifically, relates to techniques to write to multiple-port Static Random Access Memory (SRAM) circuits.

BACKGROUND

FIG. 1 is an illustration of an exemplary conventional eight transistor (8T) dual-port Static Random Access Memory (SRAM) circuit 100. The SRAM circuit 100 includes the memory cell 101, which is made of back-to-back inverters. The data value in the memory cell 101 is stored at node 102, and the inverse of the data value is stored at node 103. The SRAM circuit 100 includes two data-in lines DINa and DINb, which are in communication with respective data sources, for example multiple microprocessors. The data-in line DINa is in communication with the bit lines a_bit and a_bitb ("bit line a bar"). Similarly, the data-in line DINb is in communication with the bit lines b_bit and b_bitb ("bit line b bar"). The bit lines a_bit and a_bitb are enabled by the pass-gates 109, 111, and the bit lines b_bit and b_bitb are enabled by the pass-gates 108, 110.

The SRAM circuit 100 includes two word lines, a_wl and b_wl, corresponding to respective data sources. Word line a_wl is coupled to the memory cell 101 through pass-gates 106, 107, and the word line b_wl is coupled to the memory cell 101 through the pass-gates 104, 105.

To avoid a scenario wherein both data sources write different values to the memory element 101 at the same time, higher level logic (not shown) only allows a single write operation from one of the data sources to the circuit 100 to be performed at any given time. However, two substantially simultaneous read operations may be performed on the circuit 100 to facilitate multiple-core designs.

One problem with dual port SRAM circuits (such as the circuit 100) is that the design has double pass-gates (e.g., pass-gates 104-107) on either side of the memory cell. When a dual read operation is performed, the pass-gates 104-107 are on, and two of the bit lines are at high voltage, VDD. In the dual read operation, the high voltage of the bit lines can cause double disturbance to the cell compared to 6T designs that have only a single pass-gate on each side of the memory cell. More disturbance can lead to less stability in the example of FIG. 1, by causing values to "flip" incorrectly during dual read operations.

The relative strengths of the P-type Field Effect Transistors (PFETs) and N-type Field Effect Transistors (NFETs) in the memory cell are selected so as to give a reasonable read margin, as measured by Signal Noise Margin (SNM). However, the benefits to the read margin come at the expense of the write margin. That is, an increased read margin results in a decreased write margin (and vice versa). Thus, the selected relative strengths of the PFETs and NFETs in the memory cell may increase the difficulty of writing. The effect on the write margin is notable because, in a single write operation, data is written using only a single pass-gate on each side of the memory cell, e.g., pass-gates 106 and 107 to write from DINa. Accordingly, when the write margin is low, write speed can be somewhat slow for the circuit of FIG. 1.

BRIEF SUMMARY

According to one embodiment, a multiple-port Random Access Memory (RAM) circuit includes a data-in line coupled to multiple bit lines and multiple bit line bars, multiple word lines, a memory cell coupled to the multiple bit lines, multiple bit line bars, and multiple word lines. The multiple-port RAM circuit also includes a controller that enables the multiple word lines to write a value from the data-in line to the memory cell through the multiple bit lines and multiple bit line bars.

According to another embodiment, a method of writing a value to a multiple-port RAM circuit is disclosed. The multiple-port RAM circuit includes a data-in line in communication with multiple bit lines, a memory cell in communication with the multiple bit lines, and multiple word lines in communication with the memory cell. The method includes receiving the value on the data-in line and enabling the multiple word lines to write the value to the memory cell from the data-in line using the multiple bit lines.

According to yet another embodiment, a method of writing a value to a multiple-port RAM circuit is disclosed. The multiple-port RAM circuit includes a data-in line in communication with multiple bit lines, a memory cell in communication with the multiple bit lines, and multiple word lines in communication with the memory cell. The method includes the steps of receiving the value on the data-in line and enabling the multiple word lines to write the value to the memory cell from the data-in line using the multiple bit lines.

In another embodiment, a multiple-port RAM circuit includes a data-in line coupled to multiple bit lines and means for storing a data value. The storing means are in communication with the multiple bit lines. The multiple-port RAM circuit also includes means for writing the data value from the data-in line to the storing means using the multiple bit lines.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
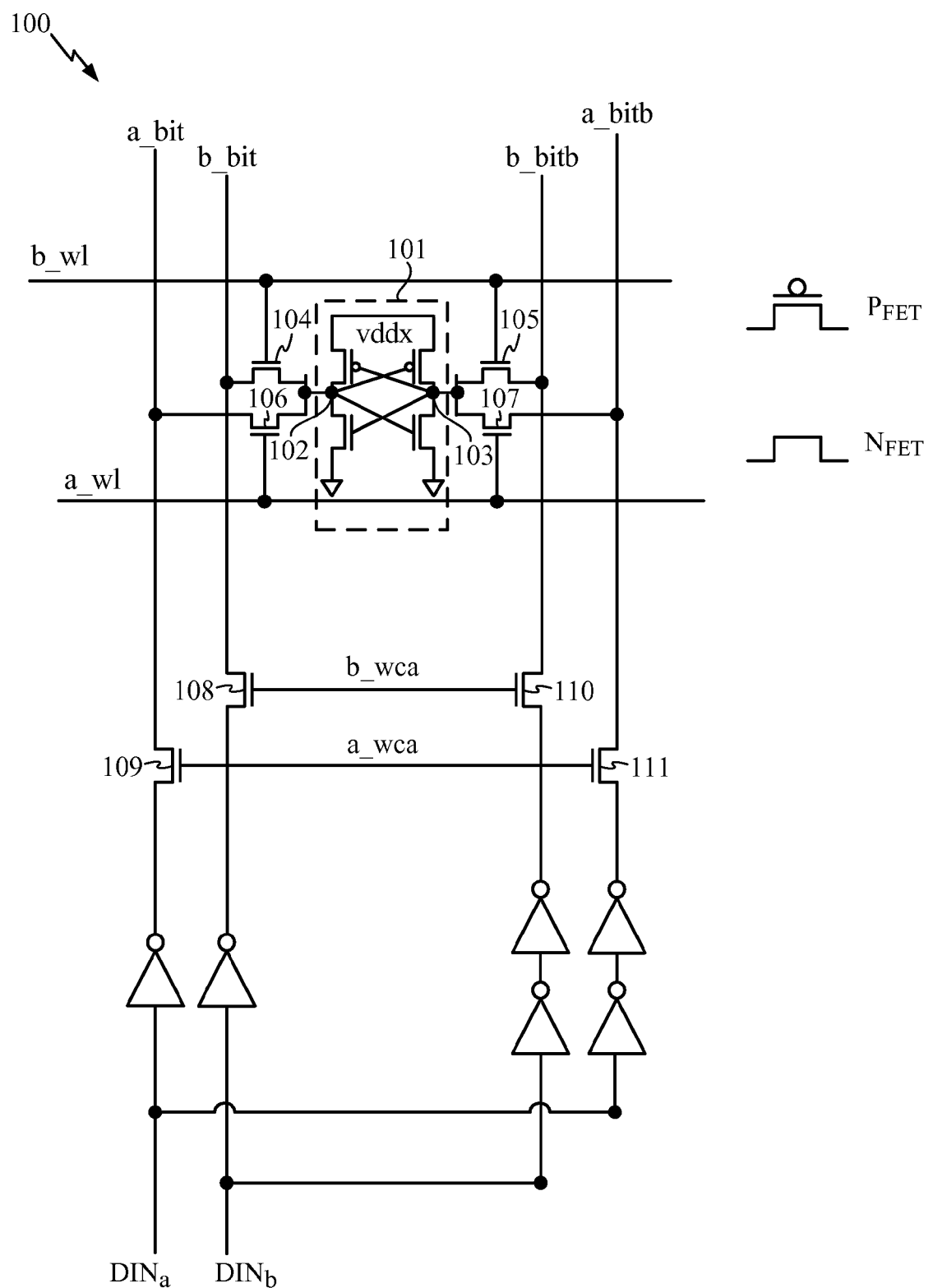
FIG. 1 is an illustration of an exemplary conventional 8T dual-port Static Random Access Memory (SRAM) circuit.
Figure 2:
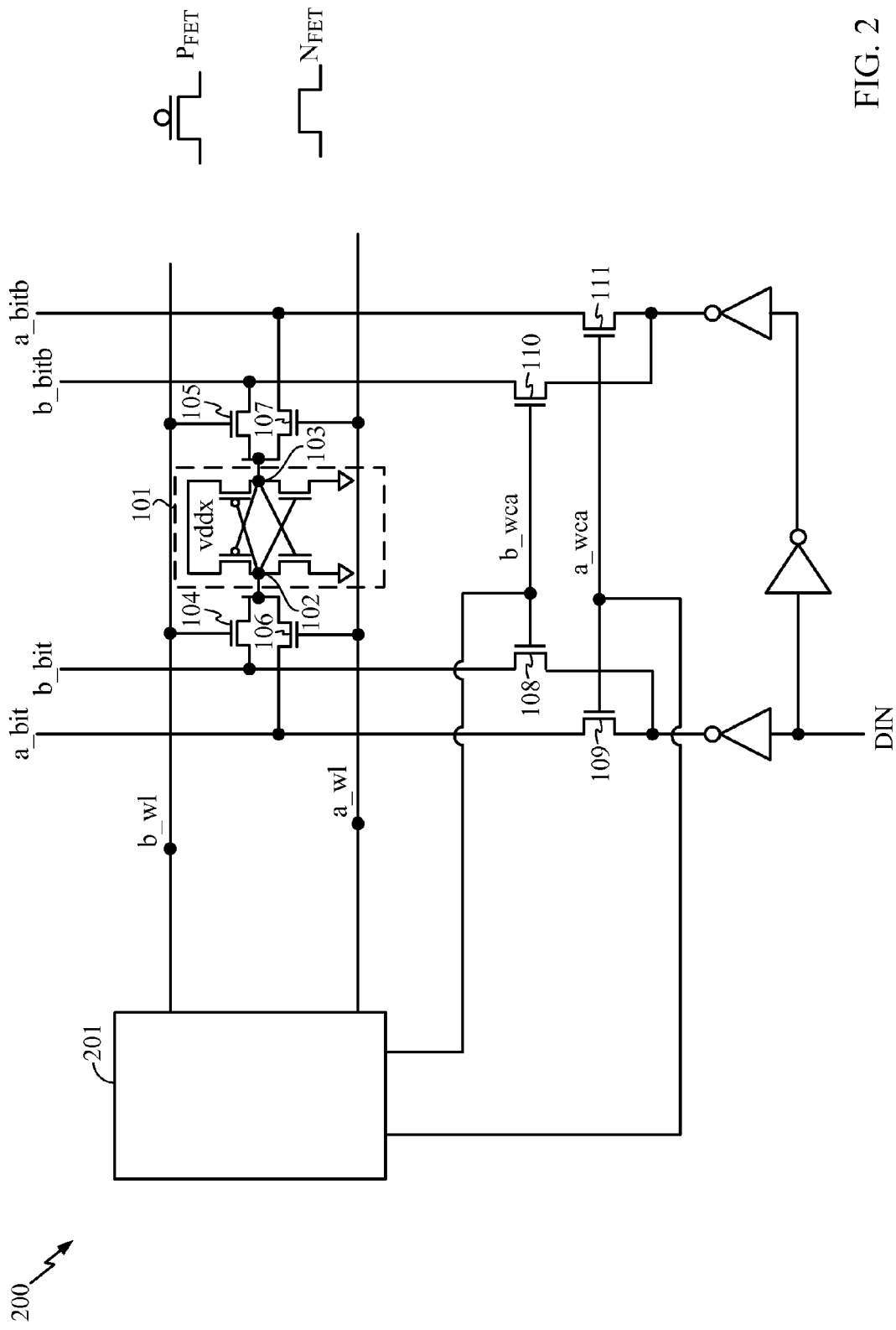
FIG. 2 is an illustration of an exemplary SRAM circuit adapted according to one embodiment of the disclosure.

FIG. 2 is an illustration of an exemplary SRAM circuit 200 adapted according to one embodiment of the disclosure. The circuit 200 includes various features in common with the circuit 100 of FIG. 1, as well as various differences.

For instance, the circuit 200 includes a single data-in line (DIN) that is coupled to all four bit lines (a_bit, b_bit) and bit line bars (a_bitb, b_bitb). The circuit 200 also includes a controller 201 that enables word lines (a_wl, b_wl) and write column address (WCA) pass-gates 108-111. The controller 201 can be a circuit, hardware, firmware, or a combination thereof. In many embodiments, the controller 201 comprises higher-level logic that performs a variety of functions, such as preventing write conflicts and the like.

In a write operation according to the embodiment of FIG. 2, the data value is received at DIN from, e.g., a microprocessor that is a part of a multiple-core system. The controller 201 then enables the word lines a_wl, b_wl and the WCA pass-gates 108-111 substantially simultaneously to write the value to the memory cell 101 using the four pass-gates 104-107. The data value is stored at the node 102 of the memory cell 101.

Referring to FIG. 1, it is noted that the circuit 100 performs a write operation using only one pass-gate per side, i.e., pass-gates 104 and 105 or pass-gates 106 and 107, at a given time. By contrast, the circuit 200 of FIG. 2 performs a write operation using two pass-gates per side at a given time. Such difference alone can, in some embodiments, increase the write margin and write speed substantially, as explained in more detail below with respect to FIG. 4.

The example above does not require exactly simultaneous enabling of the word lines a_wl, b_wl and the WCA pass-gates 108-111. Instead, the example includes substantially simultaneous enabling signals from the controller 201 such that a single write operation can be performed successfully using the bit lines a_bit, b_bit and bit line bars a_bitb, b_bitb. Furthermore, the example of FIG. 2 does not show the data-out line, but it is understood that single and dual read operations are performed on the circuit 200 in a manner similar to conventional read operations on the circuit 100 of FIG. 1. Additionally, the examples herein show embodiments adapted for use with dual-port SRAM, and it is understood that various embodiments are adaptable for use with RAM circuits having more than two ports as well. Moreover, the scope of embodiments is not limited to SRAM, as various embodiments may find application in any multiple-port RAM such as may be implemented in, e.g., Magnetoresistive Random Access Memory (MRAM) and/or the like.

Figure 3:
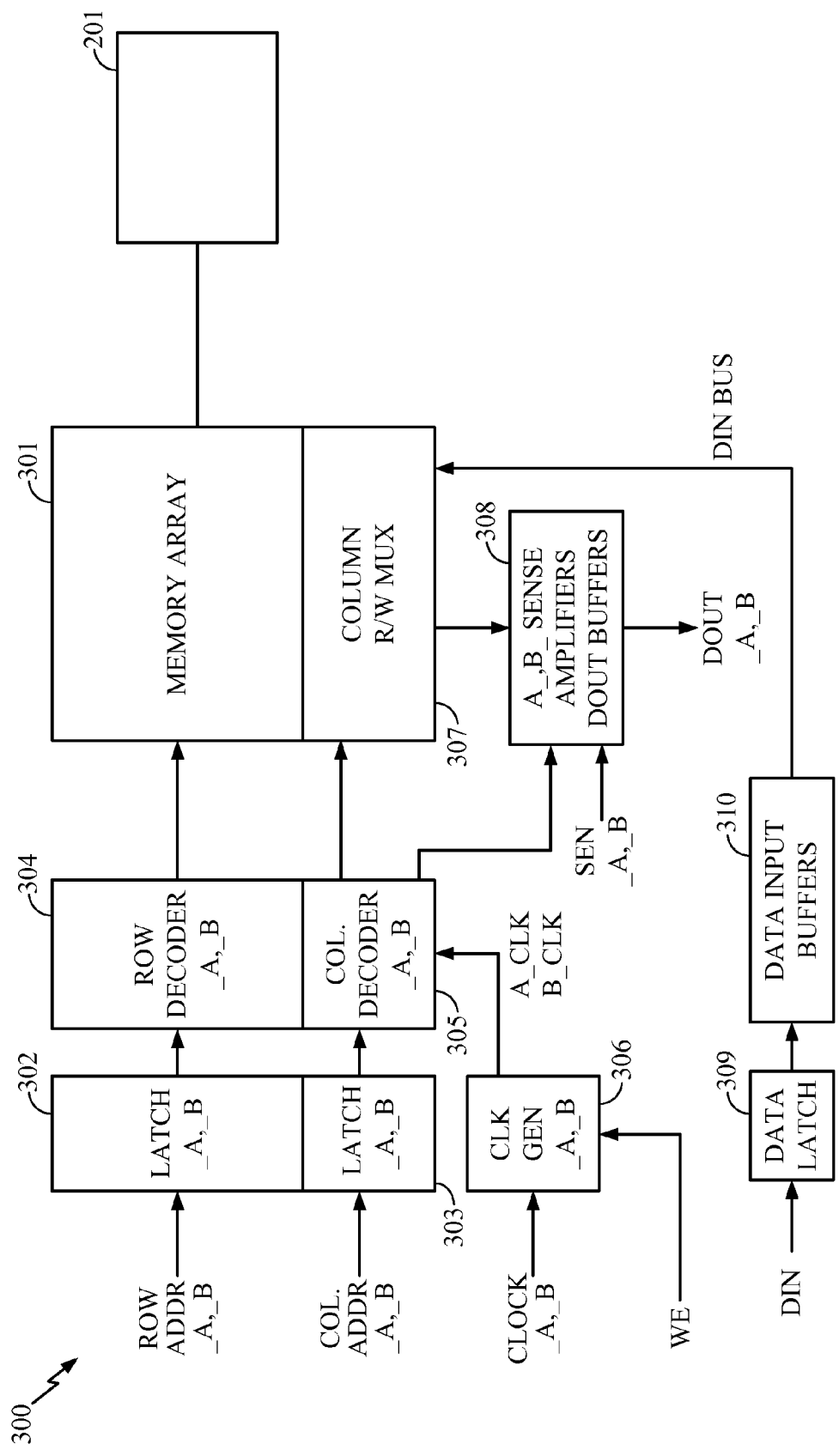
FIG. 3 is a block diagram illustration of an exemplary SRAM circuit according to one embodiment of the disclosure.

FIG. 3 is a block diagram illustration of an exemplary SRAM circuit 300 according to one embodiment of the disclosure. FIG. 3 illustrates the respective read and write paths for a dual-port SRAM circuit, such as the circuit 200 of FIG. 2.

The circuit 300 is in communication with two microprocessors (not shown), microprocessor A and microprocessor B. The data-out line DOUT includes two lines DOUTA and DOUTB, each corresponding to a respective read port and a respective microprocessor. By contrast, the circuit 300 includes only one data-in line, DIN, as in FIG. 2. The memory array 301 includes many memory cells, each of the memory cells coupled to two word lines, two bit lines, and two bit line bars, where a single example of such a memory cell is shown in FIG. 2. Each of the memory cells in the memory array 301 is in communication with the controller 201, as in FIG. 2.

For a read operation, a given row address and column address are received from a respective microprocessor, to the latches 302, 303 and to decoders 304, 305. The clock is received by the clock generator 306 and is passed to the decoders 304, 305. The decoders 304, 305 decode a logical address into a physical address in the memory array 301, and then access the memory array 301 and the column multiplexer 307 using the physical address. The value is read from the memory array 301 and passed to amplifiers and buffers 308 and output on the data-out lines DOUTA and DOUTB. The controller 201 enables and disables the word lines, bit lines, and pass-gates to facilitate the read operation. The circuit 300 can accommodate two read operations, one from each respective microprocessor, at a given time.

For a write operation, the addresses are received and processed in the same way as described above. Additionally, a write enable signal, WE, is passed to the clock generator 306 to indicate that the operation is a write operation. Although not shown in the FIGURE, the controller 201 can provide the write enable signal, WE. Data is received from the microprocessor at DIN, latched by the latch 309, buffered by the buffers 310, and provided to the column multiplexer 307. The word lines, bit lines, and pass-gates are controlled by the controller 201 to perform the write operation using both bit lines and bit line bars (not shown) and four pass-gates (also not shown) as described above with respect to FIG. 2.

Accordingly, the dual-port SRAM circuit 300 performs single read operations for a given read request using one bit line, one bit line bar, and one pass-gate on each side of a given memory cell. The SRAM circuit 300 can accommodate two read operations at the same time, even at the same memory cell. However, the SRAM circuit 300 accommodates only one write request at a time. In contrast to read operations, each write operation uses both bit lines, both bit line bars, both word lines, and both WCA pass-gates at a given memory cell to increase write margin and write speed.

Figure 4:
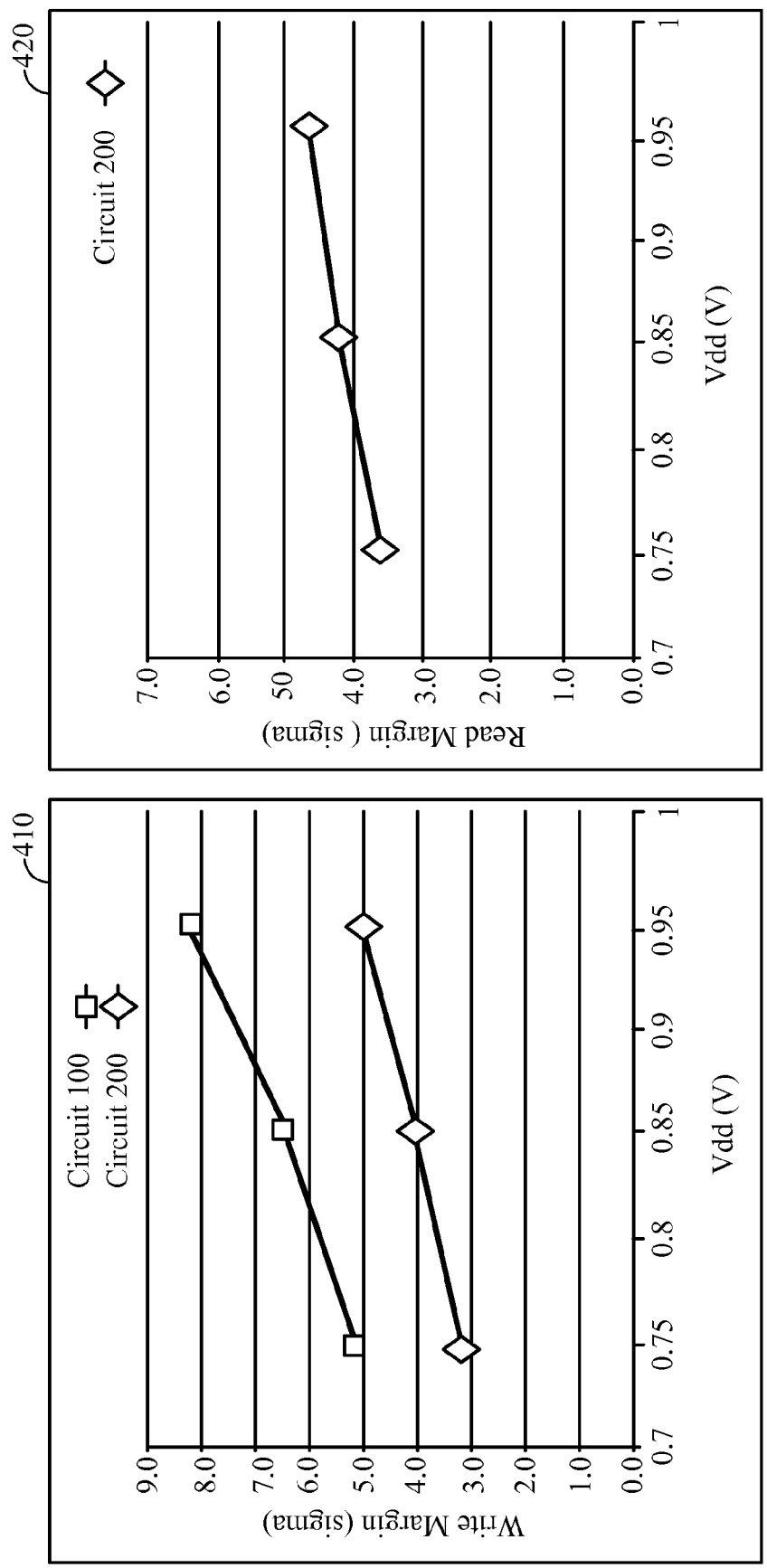
FIG. 4 is an illustration of two graphs according to one embodiment of the disclosure.

FIG. 4 is an illustration of two graphs, 410 and 420 according to one embodiment of the disclosure. The graph 410 compares write margins of one implementation of circuit 100, using only a single pass-gate on each side of the memory cell, and of an implementation of circuit 200, using two pass-gates on each side of the memory cell. As shown in graph 410, the circuit 200 has approximately a 2.5 sigma gain in write margin compared to the circuit 100 over a range of operating voltages. The write margin gain is equivalent to approximately a 200 mV operating voltage advantage for the circuit 200. In a scenario wherein the goal for the write margin is approximately six sigma, the write margin of the circuit 200 in the graph 410 exceeds such goal.

Graph 420 shows the read margin for the same implementation of the circuit 200. In a scenario where the goal for read margin is approximately six sigma, the read margin of graph 420 falls short. From one standpoint, the circuit 200 can be seen as having excess write margin and not enough read margin. One embodiment of the disclosure narrows the gap between read and write margins of circuit 200 by including selected transistors that effectively convert some write margin to read margin.

Specifically, some embodiments include strength tuning of the PFETs and NFETs of the memory cell 101 to reduce write margin while increasing read margin. In one example, the strength of the PFETs is increased relative to the strength of the NFETs and/or the strength of the NFETs is reduced relative to the strength of the PFETs. Put another way, selecting a stronger PFET may involve selecting a PFET with a lower Vt, whereas selecting a weaker NFET may involve selecting an NFET with a higher Vt. Generally, the strength of a given transistor is measured by its drive current, and the drive current of the transistor is modulated by its Vt. Higher Vt provides lower drive current, whereas lower Vt provides higher drive current. In some embodiments, a ratio of drive current for the NFETs to the drive current of the PFETs is about 1.5 to 2

Figure 5:
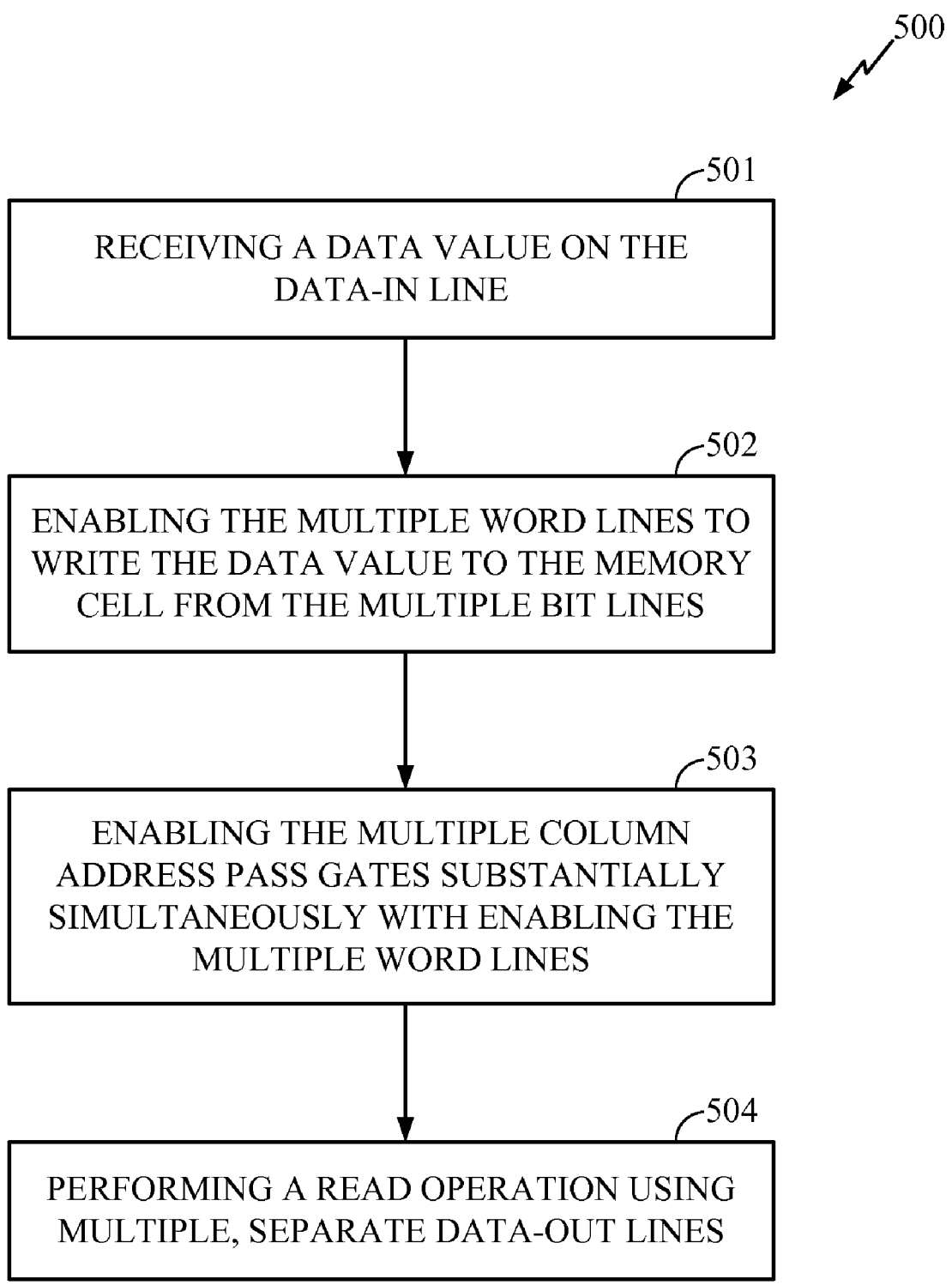
FIG. 5 is an illustration of the exemplary process adapted according to one embodiment of the disclosure.

FIG. 5 is an illustration of the exemplary process 500 adapted according to one embodiment of the disclosure. The process 500 may be performed, for example, by a memory circuit, such as the circuit 200 of FIG. 2 or the circuit 300 of FIG. 3.

In block 501, a data value is received on the data-in line from, e.g., one of a group of processors. An example of a data value in a binary digital system is a one or a zero. In this example, there is one data-in line, at least two word lines, at least two bit lines, and at least two bit line bars per memory cell.

In block 502, the multiple word lines are enabled for a memory cell. Also, in block 503, multiple column address pass-gates of the memory cell are enabled substantially simultaneously with the enabling of the multiple word lines. As a result of the actions of blocks 502 and 503, the data value is written to the memory cell from multiple bit lines. Thus, a single value is written from multiple bit lines to a single memory cell.

In block 504, a read operation is performed using multiple, separate data-out lines. Thus, in contrast to the write path, which has a single data-in line, the read path has multiple data-out lines.

FIG. 5 is shown as a series of discrete actions, but the scope of embodiments is not so limited. Various embodiments may add, omit, rearrange, or modify any of the various actions of FIG. 5. For example, in some applications, the read operation of block 504 may be performed at the same time as the write operation of blocks 501-503, assuming that values are written and read from different memory cells of a memory array. In fact, in a dual-port embodiment, as many as two read operations or a read and a write operation may be performed at the same time. For a given memory array, multiple microprocessors may repeatedly read from and write to the various memory cells, sometimes writing and sometimes reading and performing the write operations as described above with respect to FIGS. 2 and 3.

Various embodiments may include one or more advantages over the conventional memory circuit of FIG. 1. For instance, the example circuit 100 of FIG. 1, while having an acceptable read margin, has a write margin that could be improved. By contrast, some embodiments increase the write margin by using at least two pass-gates per side of a memory cell to perform a write operation, without negatively affecting the read margin. Furthermore, some embodiments may take advantage of the increased write margin by using transistors that increase the read margin (and decrease the write margin) such that both read and write margins are within an acceptable range.

Figure 6:
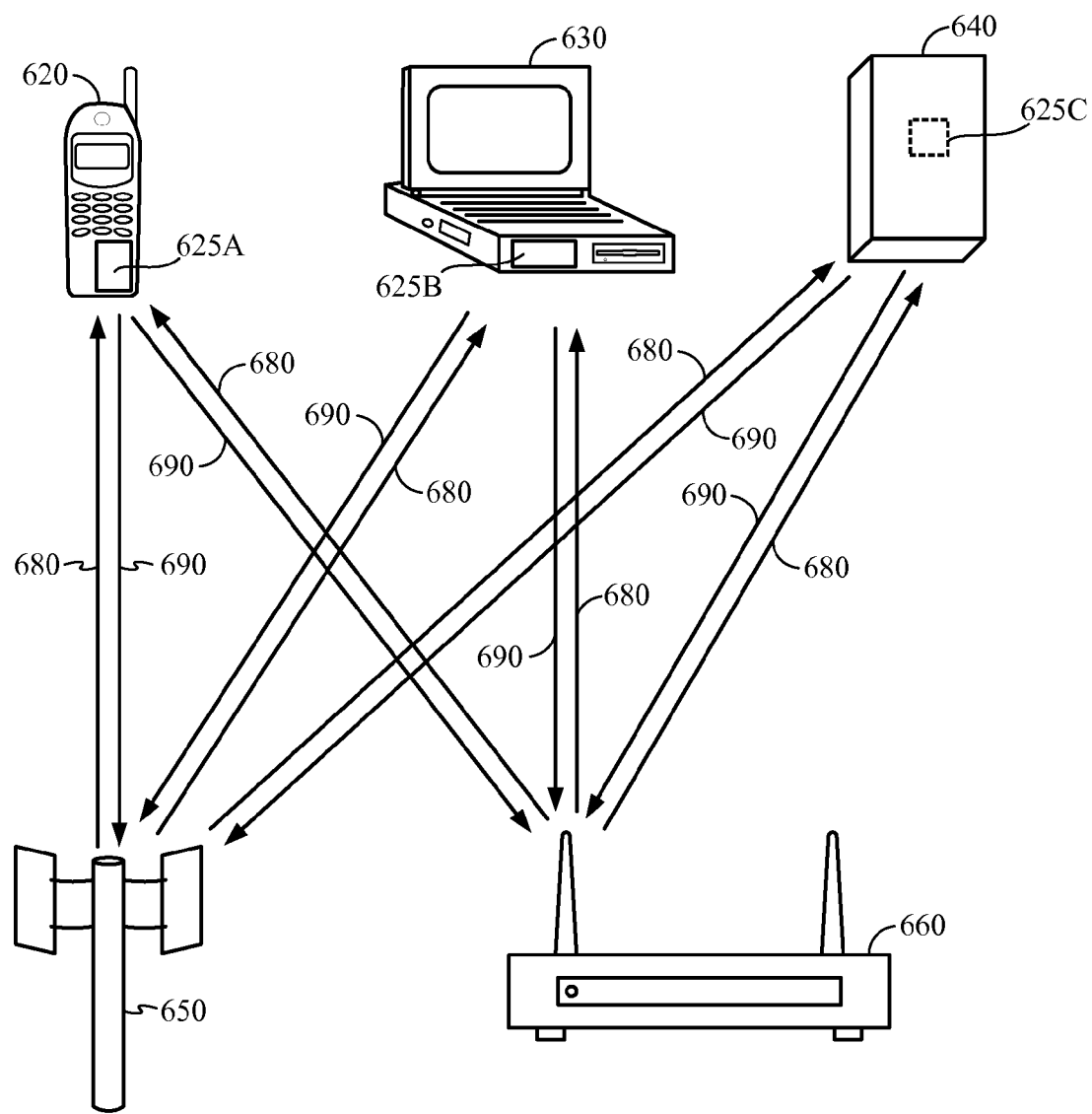
FIG. 6 shows an exemplary wireless communication system in which an embodiment of the disclosure may be advantageously employed.

FIG. 6 shows an exemplary wireless communication system 600 in which an embodiment of the disclosure may be advantageously employed. For purposes of illustration, FIG. 6 shows three remote units 620, 630, and 640 and two base stations 650, 660. It will be recognized that wireless communication systems may have many more remote units and base stations. The remote units 620, 630, and 640 include improved semiconductor processor devices 625A, 625B, and 625C, respectively, which in various embodiments include RAM circuits, as discussed further above. In some embodiments, improved semiconductor devices are also included in base stations 650, 660. The functionality described in more detail above can be implemented using executable code stored to a computer-readable medium integral to, or separate from, the processor devices 625A, 625B, and 625C. FIG. 6 shows the forward link signals 680 from the base stations 650, 660 and the remote units 620, 630, and 640 and the reverse link signals 690 from the remote units 620, 630, and 640 to base stations 650, 660.

In FIG. 6, the remote unit 620 is shown as a mobile telephone, the remote unit 630 is shown as a portable computer, and the remote unit 640 is shown as a computer in a wireless local loop system. For example, the remote units may include mobile devices, such as cell phones, hand-held personal communication systems (PCS) units, portable data units such as personal data assistants; the remote units may also include fixed location data units such as meter reading equipment. Although FIG. 6 illustrates remote units according to the teachings of the disclosure, the disclosure is not limited to these exemplary illustrated units. The disclosure may be suitably employed in any device which includes multiple-port RAM.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A multiple-port Random Access Memory (RAM) circuit comprising:
    a data-in line coupled to multiple bit lines and multiple bit line bars;
    multiple word lines;
    a memory cell coupled to the multiple bit lines, multiple bit line bars, and multiple word lines; and
    a controller that enables the multiple word lines to write a value from the data-in line to the memory cell through the multiple bit lines and multiple bit line bars.

2. The multiple-port RAM circuit of claim 1 further comprising:
    multiple write column address pass-gates in communication with the multiple bit lines and multiple bit line bars, in which the controller enables the multiple write column address pass-gates to write the value.

3. The multiple-port RAM circuit of claim 2 in which the controller enables at least two of the word lines substantially simultaneously and at least two of the write column address pass-gates substantially simultaneously.

4. The multiple-port RAM circuit of claim 1 in which the memory cell includes a first type of transistor and a second type of transistor, further in which a ratio of drive current of the first type of transistor and drive current of the second type of transistor is between 1.5 and 2.

5. The multiple-port RAM circuit of claim 4 in which the first type of transistor comprises a N-type Field Effect Transistor (NFET), and the second type of transistor comprises an P-type Field Effect Transistor (PFET).

6. The multiple-port RAM circuit of claim 1 incorporated into a device selected from a group consisting of a music player, a video player, an entertainment unit, a navigation device, a communications device, a personal digital assistant (PDA), a fixed location data unit, and a computer.

7. The multiple-port RAM circuit of claim 1, in which the multiple-port RAM circuit is integrated into a semiconductor die.

8. The multiple-port RAM circuit of claim 1 in which the data-in line, the multiple bit lines, the multiple bit line bars, the multiple word lines, and the memory cell are integrated into a memory array with a plurality of additional memory cells.

9. A multiple-port Random Access Memory (RAM) circuit comprising:
    a data-in line coupled to multiple bit lines;
    means for storing a data value, the storing means in communication with the multiple bit lines; and
    means for writing the data value from the data-in line to the storing means using the multiple bit lines.

10. The multiple-port RAM circuit of claim 9 in which the storing means include a first type of transistor and a second type of transistor, further in which a ratio of drive current of the first type of transistor and drive current of the second type of transistor is between 1.5 and 2.

11. The multiple-port RAM circuit of claim 9 incorporated into a device selected from a group consisting of a music player, a video player, an entertainment unit, a navigation device, a communications device, a personal digital assistant (PDA), a fixed location data unit, and a computer.

12. The multiple-port RAM circuit of claim 9, in which the multiple-port RAM circuit is integrated into a semiconductor die.

* * * * *